United States Patent
Huang et al.

(10) Patent No.: US 9,035,668 B2
(45) Date of Patent: May 19, 2015

(54) TOUCH TESTING SYSTEM AND TOUCH TESTING METHOD THEREOF

(71) Applicant: Hannstar Display Corporation, New Taipei (TW)

(72) Inventors: Chien-Hsiang Huang, Tainan (TW); Hui-Ju Chen, Tainan (TW)

(73) Assignee: HannStar Display Corporation, Taipei (TW)

( * ) Notice: Subject to any disclaimer, the term of this patent is extended or adjusted under 35 U.S.C. 154(b) by 110 days.

(21) Appl. No.: 13/776,731

(22) Filed: Feb. 26, 2013

(65) Prior Publication Data

US 2014/0009180 A1 Jan. 9, 2014

(30) Foreign Application Priority Data

Jul. 5, 2012 (CN) .......................... 2012 1 0232646

(51) Int. Cl.
*G01R 31/00* (2006.01)
*G01R 31/01* (2006.01)
*G06F 3/044* (2006.01)

(52) U.S. Cl.
CPC .............. *G01R 31/016* (2013.01); *G06F 3/044* (2013.01)

(58) Field of Classification Search
CPC ............................... G01R 31/016; G06F 3/044
USPC .............. 324/750.01–750.07, 500, 519, 425, 324/427, 750.17, 754.28, 548, 658, 600, 324/686, 76.66, 76.11; 345/176, 174, 659, 345/173, 443
See application file for complete search history.

(56) References Cited

U.S. PATENT DOCUMENTS

2009/0189617 A1* 7/2009 Burns et al. .................... 324/649
2012/0293455 A1* 11/2012 Shen et al. ..................... 345/174

* cited by examiner

*Primary Examiner* — Melissa Koval
*Assistant Examiner* — Trung Nguyen
(74) *Attorney, Agent, or Firm* — Jianq Chyun IP Office

(57) ABSTRACT

A touch testing system for a capacitive touch device and a method thereof are provided. The system includes a test fixture, at least one magnetization component, at least one magnetic induction component and a driving unit. The fixture is disposed on the touch device and has at least one chute on a position corresponding to the touching area. The magnetization component is disposed on the fixture and enabled by a driving signal to produce a magnetic force. The magnetic induction component is slidably disposed in the chute and inducts the magnetic force to slide along the chute, such that the sensing unit produces a touch testing information. The driving unit is coupled to the magnetization component and the sensing unit, provides the driving signal to enable the magnetization component and receives the touch testing information to feed back a testing result on the capacitive touch device accordingly.

19 Claims, 9 Drawing Sheets

TOUCH TESTING SYSTEM AND TOUCH TESTING METHOD THEREOF

CROSS-REFERENCE TO RELATED APPLICATION

This application claims the priority benefit of China application serial no. 201210232646.3, filed on Jul. 5, 2012. The entirety of the above-mentioned patent application is hereby incorporated by reference herein and made a part of this specification.

BACKGROUND OF THE INVENTION

1. Field of the Invention

The present invention generally relates to a testing system, and more particularly, to a touch testing system for a capacitive touch device.

2. Description of Related Art

Along with the advances in technology, in order to bring more carry convenience, more compact size and more human-friendly operating, many information products have added the touch panel as an input device in comparison with the traditional input devices such as keyboard or mouse.

In general, the touch panel manufacturers must conduct testing on their products before shipment to ensure product quality. During the testing, usually an operator uses the fingers thereof to touch a specific location on the touch panel, or by using a robotic arm or other testing mechanisms to touch a specific location of the touch panel, so as to test whether or not the touch device can normally output the corresponding sensor signal and determine the properly working of the tested touch device.

However, using human touch way may lead to a misjudgment due to the human factors, while using the robotic arm for testing may lead to a too-high cost, so that such testing means are adapted for the R & D testing only. In addition, for manufacturers with huge yield, the mechanical arm test way is difficult to be used in the actual production line. In particular, regardless of the human testing way or the testing way through testing mechanisms, each touch device still needs to be individually tested, where a long time to test is inevitable so that the labor consumption or the testing equipment cost are difficult to be reduced.

SUMMARY OF THE INVENTION

Accordingly, the present invention is directed to a touch testing system, which is able to advance the stability during testing on a capacitive touch panel by using magnetic control mechanism so as to further increase the testing accuracy.

The present invention is also directed to a touch testing method able to conduct touch testing on a capacitive touch device by using magnetic control mechanism.

To achieve the above-mentioned advantages, the present invention provides a touch testing system adapted to conduct test on at least one capacitive touch device, in which the capacitive touch device includes a capacitive touch panel and a sensing unit and the capacitive touch panel has a touching area. The touch testing system includes a test fixture, at least one magnetization component, at least one magnetic induction component and a driving unit. The test fixture is disposed on the capacitive touch device, in which the test fixture has at least one chute on a position corresponding to the touching area. The magnetization component is disposed on the test fixture, in which the magnetization component is enabled according to a driving signal and thereby produces a magnetic force. The magnetic induction component is slidably disposed in the chute and inducts the magnetic force to slide along the chute so that the sensing unit thereby produces a touch testing information. The driving unit is coupled to the magnetization component and the sensing unit, provides the driving signal to enable the magnetization component and receives the touch testing information so as to feed back a testing result on the capacitive touch device according to the touch testing information.

The present invention also provides a touch testing method configured to conduct test on at least one capacitive touch device, in which the capacitive touch device includes a capacitive touch panel and a sensing unit, and the capacitive touch panel has a touching area. The touch testing method includes: disposing a test fixture on the a capacitive touch device, in which the test fixture has at least one chute on a position corresponding to the touching area; slidably disposing at least one magnetic induction component in the at least one chute; providing a driving signal to enable at least one magnetization component so that the magnetization component thereby produces a magnetic force; making the magnetic induction component induct the magnetic force to slide along the chute so that the sensing unit thereby produces a touch testing information; and feeding back a testing result on the capacitive touch device according to the touch testing information.

Based on the description above, the touch testing system in the embodiments of the invention not only makes the magnetic induction component used for testing slide on the fixed directions by using a mechanism with chutes, but also provides corresponding magnetic forces through controlling the magnetization component so that the magnetic induction component can stably slide in the chutes. As a result, the touch testing system can largely advance the stability during the testing and the testing accuracy without increasing additional cost.

Reference will now be made in detail to the present preferred embodiments of the invention, examples of which are illustrated in the accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
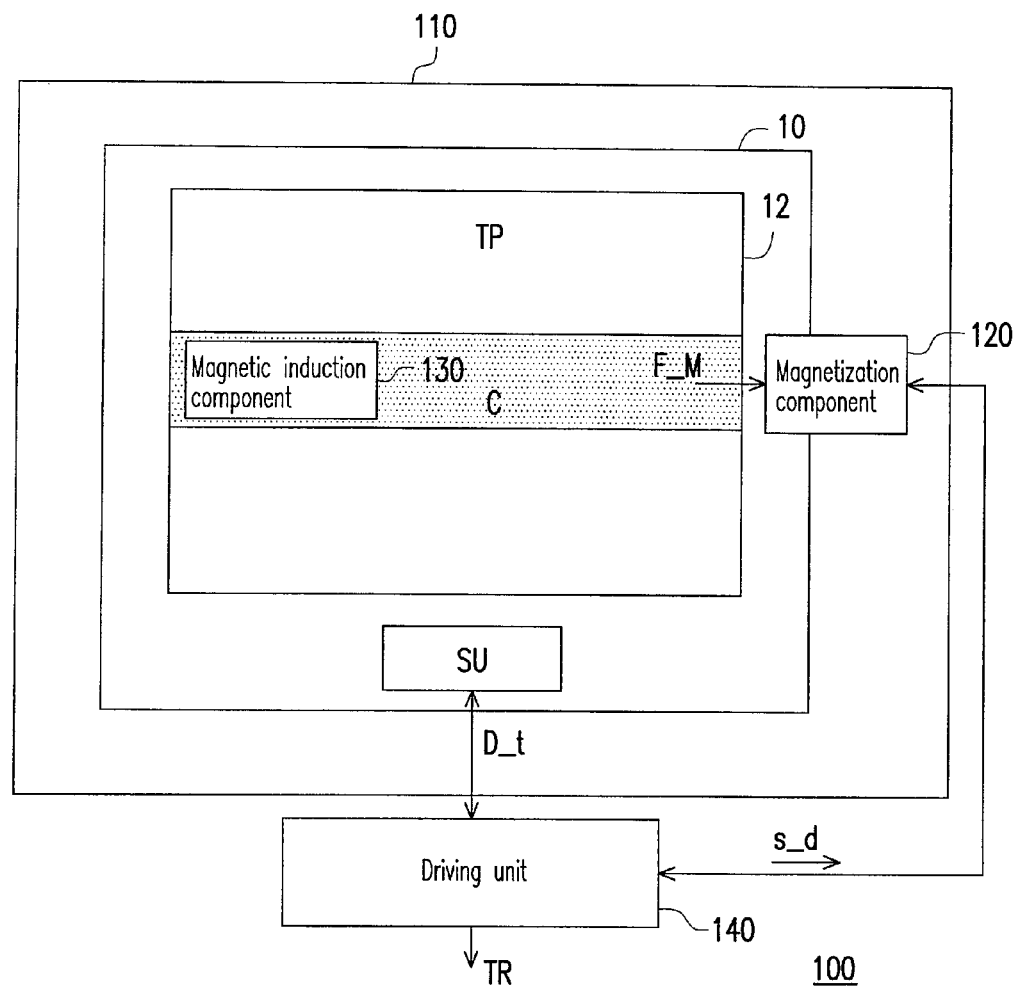
FIG. 1 is a schematic diagram of a touch testing system 100 according to an embodiment of the present invention.

The embodiments of the invention provides a touch testing system where a test fixture with a chute is disposed on a capacitive touch device and a driving signal provided by a driving unit is used to make a magnetization component on the test fixture produce a magnetic force so that a magnetic induction component inducts the magnetic force to slide in the chute. In this way, through the testing way that the magnetic induction component stably slides in the chute according to the magnetic force, the touch testing system can reduce the touch testing error to the minimum and the labor cost can be further reduced. In order to easier understand the detail of the present preferred embodiments of the invention, feasible examples of which are illustrated in the accompanying drawings. Wherever possible, the same reference numbers in the drawings and the description of the embodiments are used to refer to the same or like parts.

FIG. 1 is a schematic diagram of a touch testing system 100 according to an embodiment of the present invention. In the embodiment, the touch testing system 100 is adapted to conduct testing on a capacitive touch device 10, in which the capacitive touch device 10 includes a capacitive touch panel TP and a sensing unit SU, and the capacitive touch panel TP has a touching area 12.

Referring to FIG. 1, the touch testing system 100 includes a test fixture 110, a magnetization component 120, a magnetic induction component 130 and a driving unit 140. The test fixture 110 is disposed on the capacitive touch device 10, in which the test fixture 110 has a chute C on the position corresponding to the touching area 12 of the capacitive touch panel TP. The magnetization component 120 is disposed on the test fixture 110, the magnetization component is enabled according to a driving signal s_d and thereby produces a magnetic force F_M. The magnetic induction component 130 is slidably disposed in the chute C and inducts the magnetic force F_M produced by the magnetization component 120 to slide along the chute C. The driving unit 140 is coupled to the magnetization component 120 and the sensing unit SU. The driving unit 140 provides the driving signal s_d to enable the magnetization component 120 and receives a touch testing information D_t from the sensing unit SU so as to feed back a testing result TR on the capacitive touch device 10 to an external host according to the touch testing information D_t.

Figure 2:
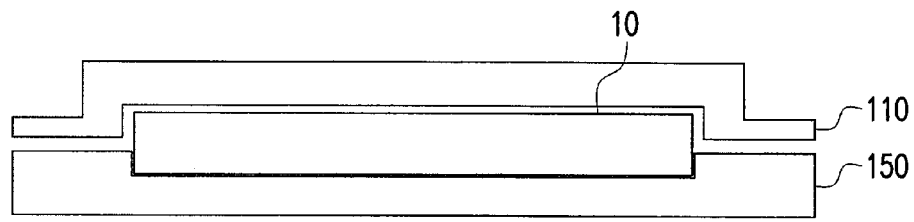
FIG. 2 is a side-view diagram of the touch testing system 100 according to the embodiment of FIG. 1.

In more details, to further increase the stability during the testing, the touch testing system 100 further includes a carrying platform 150, as shown by FIG. 2. FIG. 2 is a side-view diagram of the touch testing system 100 according to the embodiment of FIG. 1. Referring to FIG. 2, the carrying platform 150 is used for fixing the capacitive touch device 10. In the embodiment, the carrying platform 150 has a chute design corresponding to the dimension of the capacitive touch device 10 to fix the capacitive touch device 10 placed thereon. However, in other embodiments, the carrying platform 150 can also fix the capacitive touch device 10 by adhering or other fixing ways, which the present invention is not limited to.

In addition, FIG. 2 only shows the carrying platform 150 for fixing a single capacitive touch device 10. However, during simultaneously conducting testing on a plurality of capacitive touch devices, the carrying platform 150 can fix the capacitive touch devices in array arrangement way to simultaneously conduct testing on the capacitive touch devices (the method of simultaneously testing a plurality of capacitive touch devices is described later).

Figure 3:
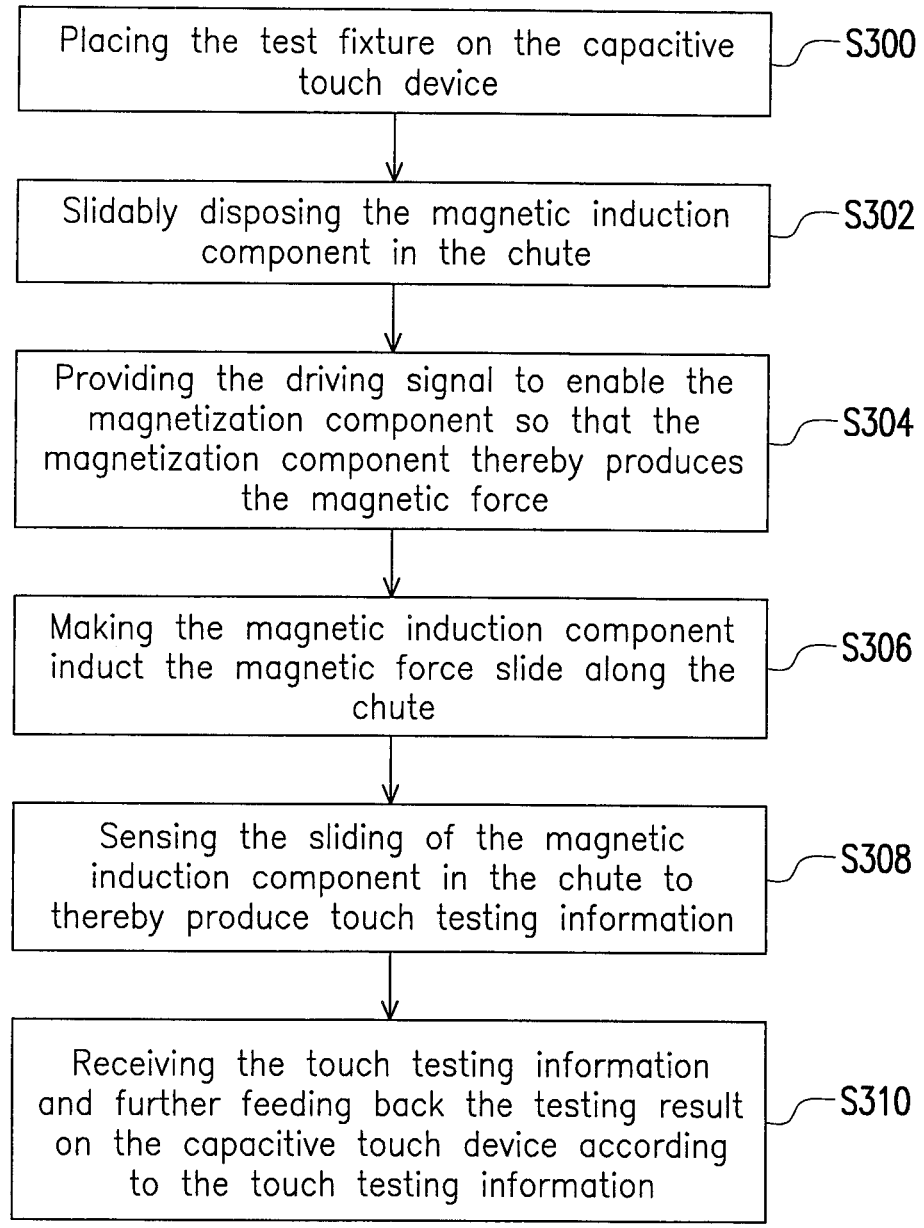
FIG. 3 is a flowchart of a touch testing method according to the embodiment of FIG. 1.

FIG. 3 is a flowchart of a touch testing method according to the embodiment of FIG. 1. Referring to FIGS. 1 and 3, during conducting testing on the capacitive touch device 10 by using the touch testing system 100, first, the operator places the test fixture 110 on the capacitive touch device 10 (step S300) and slidably disposes the magnetic induction component 130 in the chute C (step S302). Next, the driving unit 140 provides the driving signal s_d to enable the magnetization component 120 so that the magnetization component 120 thereby produces the magnetic force F_M (step S304).

Then, the magnetic induction component 130 inducts the magnetic force F_M to slide along the chute C towards the magnetization component 120 (step S306), so that the sensing unit SU can produce the corresponding touch testing information D_t based on the sliding of the magnetic induction component 130 on the touching area 12 (step S308). Thereafter, the driving unit 140 receives the touch testing information D_t and further feeds back the testing result TR on the capacitive touch device 10 according to the received touch testing information D_t (step S310).

It can be seen the touch testing system 100 of the embodiment uses a magnetic induction way to make the magnetic induction component 130 for testing slide in the chute C. In more details, in order to provide the sliding stability of the magnetic induction component 130 to increase the testing accuracy, the driving unit 140 can gradually adjust the output driving signal s_d according to the varied distance between the magnetic induction component 130 and the magnetization component 120, so that the magnetic induction component 130 can slide in the chute C with a constant speed. In addition, the chute C can be a concave chute to restrict the sliding direction based on the structure of the chute C and to advance the stability somehow.

During testing a capacitive touch device, usually, an operator uses the finger thereof to draw lines on the touching area 12 of the capacitive touch panel TP to test whether or not the electrodes of the touching area can normally sense the touching. However, such human testing way not only easily causes an error with the testing result due to unstable operation, but also increases the labour cost. In addition, the testing way by using a robotic arm leads to a too expensive cost to suit the product testing on a massive production line.

Therefore, in addition to adding a chute C in the touch testing system 100 to ensure stable sliding of the magnetic induction component 130 in a fixed direction during the testing, the touch testing system 100 further uses the magnetic induction to control the moving speed of the magnetic induction component 130 so as to further advance the stability during the testing.

Figure 4:
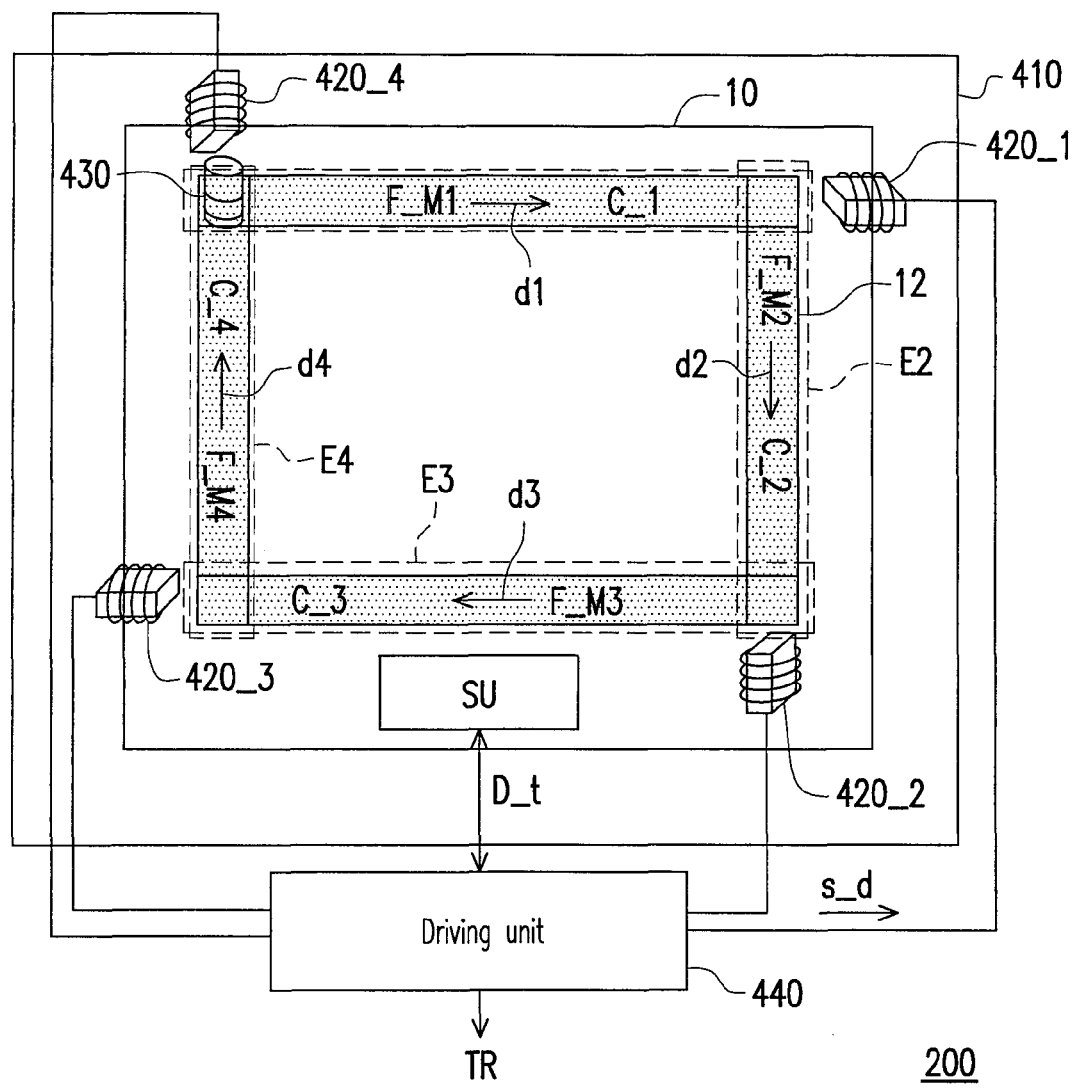
FIG. 4 is a schematic diagram of a touch testing system 400 according to an embodiment of the present invention.

FIG. 4 is a schematic diagram of a touch testing system 400 according to an embodiment of the present invention for further explaining the invention. Referring to FIG. 4, a touch testing system 400 includes a test fixture 410, magnetization components 420_1-420_4, a magnetic induction component 430 and a driving unit 440. The test fixture 410 herein can be, for example, an acrylic plate with a concave chute, the magnetization components 420_1-420_4 can be, for example, electromagnets and the magnetic induction component 430 can be, for example, a testing cylinder made of a compound of copper and magnetic materials.

Usually, the electrodes on a capacitive touch panel are electrically connected to each other via an induction channel, so that in the embodiment, the touch testing system 400 further uses the electrodes on the edges of the touching area 12 to judge whether or not there is interruption with the induction channel in the capacitive touch panel TP.

In the embodiment, the test fixture 410 has a first chute C_1, a second chute C_2, a third chute C_3 and a fourth chute C_4 which are respectively corresponding to the positions of a first edge E1, a second edge E2, a third edge E3 and a fourth edge E4 disposed in the touching area 12, so that the magnetic induction component 430 can slide between the first chute C_1, the second chute C_2, the third chute C_3 and the fourth chute C_4 for testing the electrodes on the edges of the touching area 12.

In more details, the first chute C_1, the second chute C_2, the third chute C_3 and the fourth chute C_4 are respectively corresponding to the first edge E1, the second edge E2, the third edge E3 and the fourth edge E4, the first end of the second chute C_2 connects the second end of the first chute C_1, the first end of the third chute C_3 connects the second end of the second chute C_2, the first end of the fourth chute C_4 connects the second end of the third chute C_3, and the second end of the fourth chute C_4 connects the first end of the first chute C_1.

In order to make the magnetic induction component 430 sequentially slide in the first edge E1, the second edge E2, the third edge E3 and the fourth edge E4, the magnetization components 420_1-420_4 in the embodiment include a first magnetization component 420_1, a second magnetization component 420_2, a third magnetization component 420_3 and a fourth magnetization component 420_4 respectively corresponding to the first chute C_1, the second chute C_2, the third chute C_3 and the fourth chute C_4. The first magnetization component 420_1, a second magnetization component 420_2, a third magnetization component 420_3 and a fourth magnetization component 420_4 herein are respectively disposed at the junction of the first chute C_1 and the second chute C_2, the junction of the second chute C_2 and the third chute C_3, the junction of the third chute C_3 and the fourth chute C_4 and the junction of the fourth chute C_4 and the first chute C_1, and are enabled according to the driving signal s_d to respectively provide a first magnetic force F_M1 in a first direction d1, a second magnetic force F_M2 in a second direction d2, a third magnetic force F_M3 in a third direction d3 and a fourth magnetic force F_M4 in a fourth direction d4.

Figure 5:
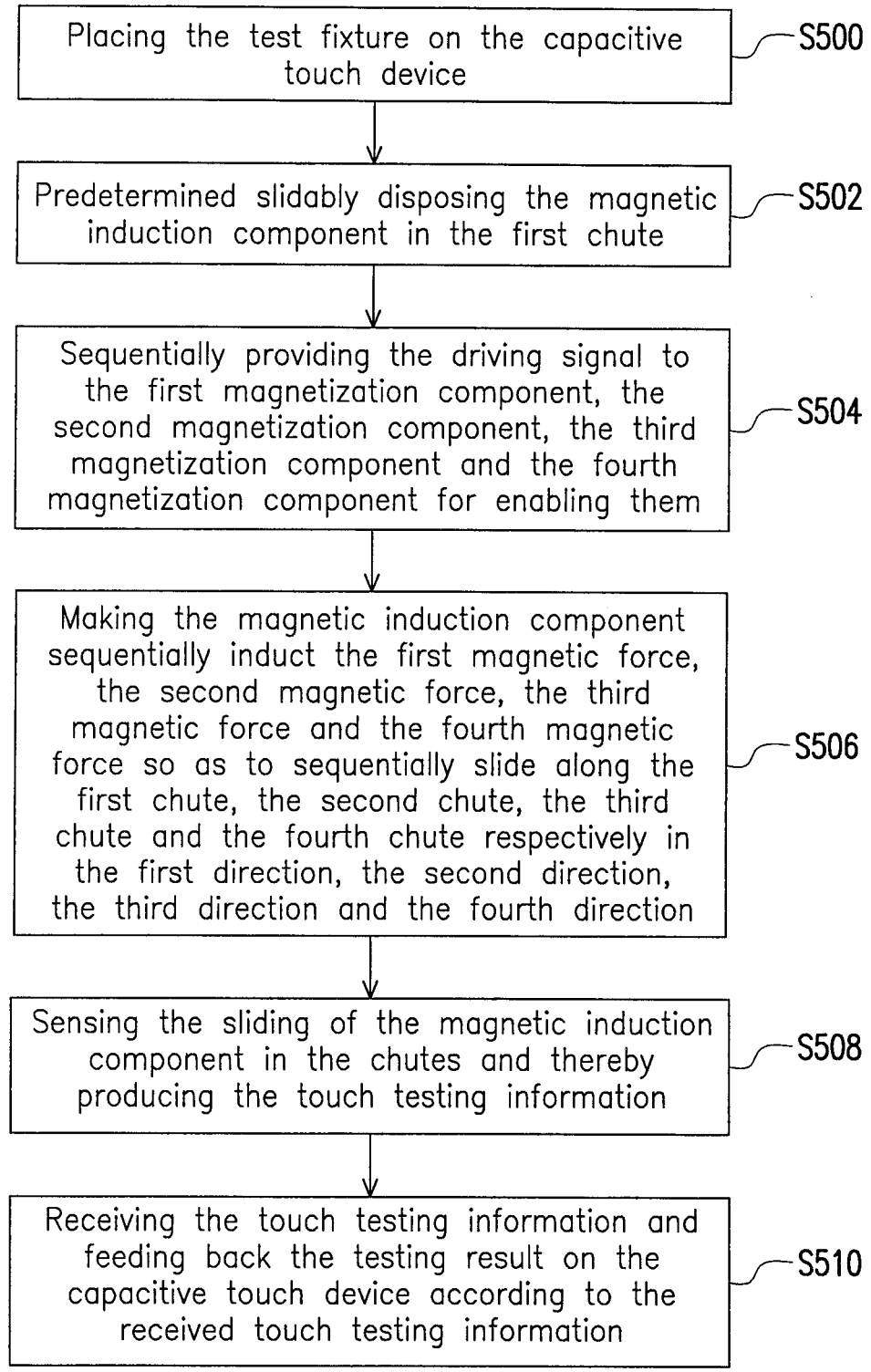
FIG. 5 is a flowchart of a touch testing method according to the embodiment of FIG. 4.

When the operator wants to use the touch testing system 400 to conduct testing on the capacitive touch device 10, the testing flow is given by FIG. 5, in which FIG. 5 is a flowchart of a touch testing method according to the embodiment of FIG. 4. Referring to FIGS. 4 and 5, after the operator places the capacitive touch device 10 at the carrying platform (not shown), first, the operator places the test fixture 410 on the capacitive touch device 10 at the corresponding position (step S500) so that the first chute C_1, the second chute C_2, the third chute C_3 and the fourth chute C_4 are respectively aligned with the positions of the first edge E1, the second edge E2, the third edge E3 and the fourth edge E4. Next, prior to testing, the magnetic induction component 430 is predetermined slidably disposed in the first chute C_1 (step S502). In following, the magnetic induction component 430 is disposed at the junction of the first chute C_1 and the fourth chute C_4 as an example.

When the touch testing system 400 starts testing on the capacitive touch device 10, the driving unit 440 sequentially provides the driving signal s_d to the first magnetization component 420_1, the second magnetization component 420_2, the third magnetization component 420_3 and the fourth magnetization component 420_4 for enabling them (step S504). The magnetic induction component 430 then sequentially inducts the first magnetic force F_M1, the second magnetic force F_M2, the third magnetic force F_M3 and the fourth magnetic force F_M4 so as to sequentially slide along the first chute C_1, the second chute C_2, the third chute C_3 and the fourth chute C_4 respectively in the first direction d1, the second direction d2, the third direction d3 and the fourth direction d4 (step S506). In this way, the sensing unit SU can sense the sliding of the magnetic induction component 430 in the chutes and thereby produce the touch testing information D_t (step S508). When the driving unit 440 receives the touch testing information D_t, the testing result TR on the capacitive touch device 10 is fed back according to the received touch testing information D_t (step S510).

In more details, during the testing by the touch testing system 400, first, the driving unit 440 provides the driving signal s_d to the first magnetization component 420_1 and the first magnetization component 420_1 is enabled according to the driving signal s_d and produces the first magnetic force F_M1. At the time, the magnetic induction component 430 inducts the first magnetic force F_M1 to slide along the first chute C_1 in the first direction d1. During the sliding, the sensing unit SU durably senses the touching caused by the magnetic induction component 430 to produce the corresponding touch testing information D_t.

After the magnetic induction component 430 reaches the junction of the first chute C_1 and the second chute C_2, the driving unit 440 stops providing the driving signal s_d to the first magnetization component 420_1, and instead, provides the driving signal s_d to the second magnetization component 420_2. At the time, the magnetic induction component 430 inducts the second magnetic attractive force F_M2 produced by the second magnetization component 420_2 to slide along the second chute C_2 in the second direction d1.

Similarly, the driving unit 440 provides the driving signal s_d to the third magnetization component 420_3 and the fourth magnetization component 420_4 in the above-described way, so that the magnetic induction component 430 slides along the third chute C_3 in the third direction d3 and along the fourth chute C_4 in the fourth direction d4, and the sensing unit SU durably produces the corresponding touch testing information D_t and outputs the touch testing information D_t to the driving unit 440. After the magnetic induction component 430 finishes a circle along the first chute C_1, the second chute C_2, the third chute C_3 and the fourth chute C_4, the driving unit 440 integrates the received touch testing information D_t and then outputs the testing result TR to an external host so that the operator is aware of whether or not the capacitive touch panel TP of the capacitive touch device 10 is normal.

It should be noted that the embodiment selects the edges of the capacitive touch panel TP to conduct testing (for example, the first edge E1, the second edge E2, the third edge E3 and the fourth edge E4) so that the magnetic induction component 430 slides sequentially rightwards along the horizontal direction (the first direction d1), downwards along the vertical direction (the second direction d2), leftwards along the horizontal direction (the third direction d3) and upwards along the vertical direction (the fourth direction d4) to return back the starting point for testing. In other words, the first direction d1 and the third direction d3 are substantially the horizontal direction but towards opposite direction to each other, and the second direction d2 and the fourth direction d4 are substantially the vertical direction but towards opposite direction to each other. In other words, the magnetic induction component 430 in the embodiment clockwise slides along the edges surrounding the touching area 12 for testing. In a real application however, the magnetic induction component 430 can anticlockwise slides for testing, therefore, the sequence for the driving unit 440 to provide the driving signal s_d is not limited to the above-mentioned way.

In addition, the chutes on the test fixture are not limited to be disposed at the positions of the edges of the capacitive touch panel. In fact, the chutes can be disposed at different positions on the touching area according to the testing demand on the capacitive touch panel by the designer so that the magnetic induction component can slide in the area defined by the chutes for testing, which the present invention is not limited to.

For simultaneously testing a plurality of capacitive touch devices 10_1-10_9 with the same structure, the increased quantity of the chutes makes the driving ways of the magnetization components and the magnetic induction components during the testing quite diversity. For describing the touch testing system of the embodiment, the touch testing system and the touch testing method thereof implemented according to the configuration of the magnetization components and the magnetic induction components in FIGS. 6-9 are chosen to explain the embodiments of the invention. In fact however, once the chutes are correspondingly disposed on the touching area of every capacitive touch panel, the above-mentioned touch testing method can be used to simultaneously test the plurality of the capacitive touch devices, which the present invention is not limited to.

Figure 6:
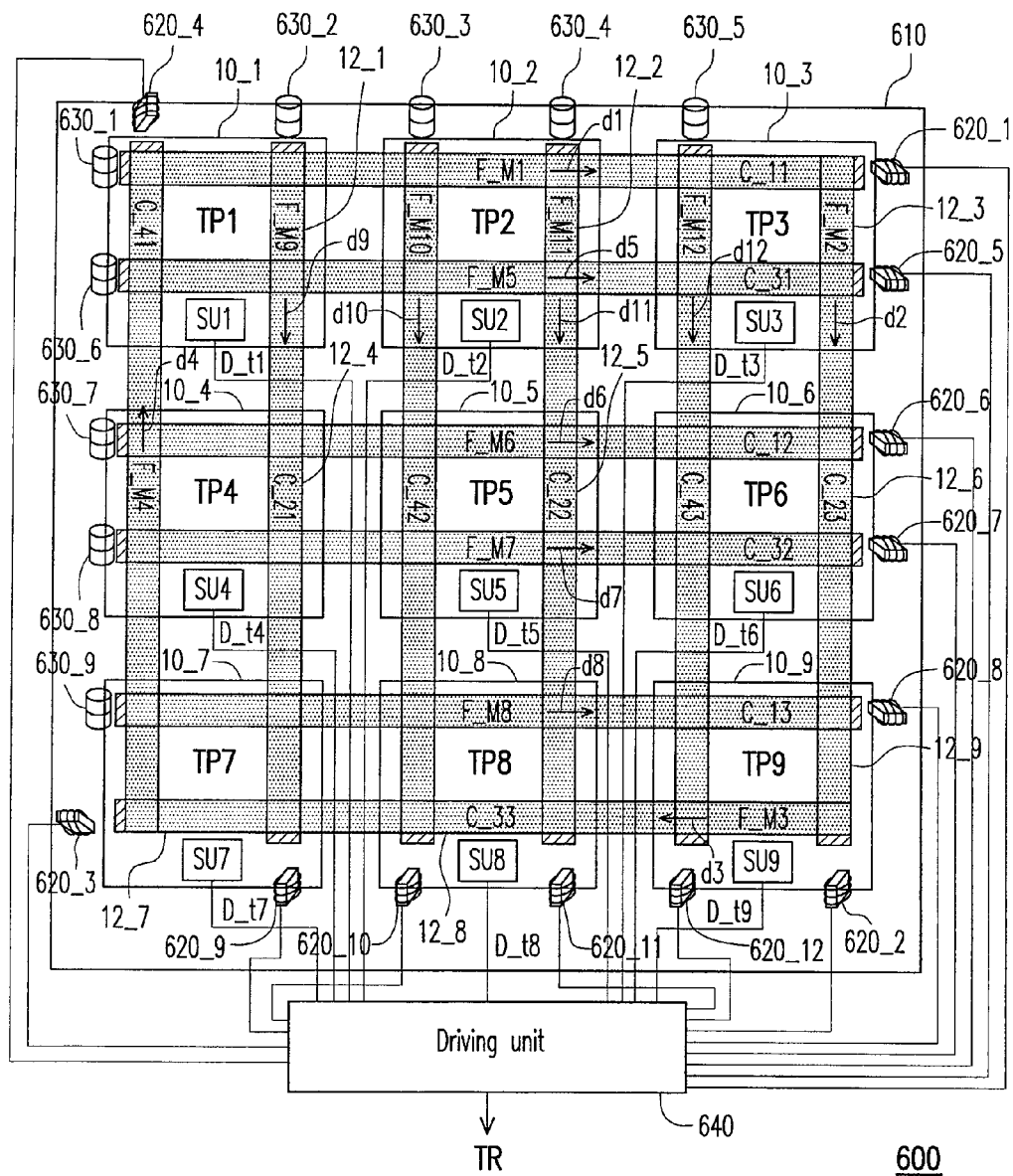
FIG. 6 is a schematic diagram of a touch testing system 600 according to an embodiment of the present invention.

FIG. 6 is a schematic diagram of a touch testing system 600 according to an embodiment of the present invention. In the embodiment, the touch testing system is able to simultaneously test a plurality of capacitive touch devices, wherein nine capacitive touch devices 10_1-10_9 are tested as an example. Referring to FIG. 6, the touch testing system 600 includes a test fixture 610, magnetization components 620_1-620_12, magnetic induction components 630_1-630_9 and a driving unit 640, in which the capacitive touch devices 10_1-10_9 are fixed by a carrying platform (not shown) in array arrangement way.

In the test fixture 610, the chutes are disposed correspondingly to the edges of the touching areas 12_1-12_9, in which the edges of each of the touching areas 12_1-12_9 can be divided into a first edge, a second edge, a third edge and a fourth edge, and the layout of the edges are the same as the embodiment of FIG. 2. For simplicity, the edges of the touching areas 12_1-12_9 are not marked.

Since the capacitive touch devices 10_1-10_9 are fixed in 2×3 array arrangement way by the carrying platform, for the capacitive touch devices belonging to a same line (for example, the capacitive touch devices 10_1-10_3, the capacitive touch devices 10_4-10_6 and the capacitive touch devices 10_7-10_9), the chutes are to be disposed on the connection lines of the first edges and the third edges by the test fixture 610. Then, when the magnetic induction components induct the magnetic forces, the magnetic induction components would slide at the first edges and the third edges of the capacitive touch panels belonging to the same line to conduct testing on the first edges and the third edges of the capacitive touch panels belonging to the same line.

Similarly, for the capacitive touch devices belonging to a same column (for example, the capacitive touch devices 10_1, 10_4 and 10_7, the capacitive touch devices 10_2, 10_5 and 10_8 and the capacitive touch devices 10_3, 10_6 and 10_9), the chutes are to be disposed on the connection lines of the second edges and the fourth edges by the test fixture 610. Then, when the magnetic induction components induct the magnetic forces, the magnetic induction components would slide at the second edges and the fourth edges of the capacitive touch panels belonging to the same column to conduct testing on the second edges and the fourth edges of the capacitive touch panels belonging to the same column.

In more details, the first chute C_11 is disposed at the position corresponding to the connection line of the first edges of the touching areas 12_1-12_3, the first chute C_12 is disposed at the position corresponding to the connection line of the first edges of the touching areas 12_4-12_6 and the first chute C_13 is disposed at the position corresponding to the connection line of the first edges of the touching areas 12_7-12_9. The second chute C_21 is disposed at the position corresponding to the connection line of the second edges of the touching areas 12_1, 12_4 and 12_7, the second chute C_22 is disposed at the position corresponding to the connection line of the second edges of the touching areas 12_2, 12_5 and 12_8 and the second chute C_23 is disposed at the position corresponding to the connection line of the second edges of the touching areas 12_3, 12_6 and 12_9. The third chute C_31 is disposed at the position corresponding to the connection line of the third edges of the touching areas 12_1-12_3, the third chute C_32 is disposed at the position corresponding to the connection line of the third edges of the touching areas 12_4-12_6 the third chute C_33 is disposed at the position corresponding to the connection line of the third edges of the touching areas 12_7-12_9. The fourth chute C_41 is disposed at the position corresponding to the connection line of the fourth edges of the touching areas 12_1, 12_4 and 12_7, the fourth chute C_42 is disposed at the position corresponding to the connection line of the fourth edges of the touching areas 12_2, 12_5 and 12_8 and the fourth chute C_43 is disposed at the position corresponding to the connection line of the fourth edges of the touching areas 12_3, 12_6 and 12_9.

The magnetization components 620_1-620_12 include the first magnetization components 620_1, 620_6 and 620_8, the second magnetization components 620 2, 620_9 and 620_11, the third magnetization components 620_3, 620_5 and 620_7 and the fourth magnetization components 620_4, 620_10 and 620_12. According to the driving signal s_d, the first magnetization components 620_1, 620_6 and 620_8 respectively provide first magnetic forces F_M1, F_M6 and F_M8 respectively with first directions d1, d6 and d8, the second magnetization components 620_2, 620_9 and 620_11 respectively provide second magnetic forces F_M2, F_M9 and F_M11 respectively with second directions d2, d9 and d11, the third magnetization components 620_3, 620_5 and 620_7 respectively provide third magnetic forces F_M3, F_M5 and F_M7 respectively with third directions d3, d5 and d7, and the fourth magnetization components 620_4, 620_10 and 620_12 respectively provide fourth magnetic forces F_M4, F_M10 and F_M12 respectively with fourth directions d4, d10 and d12.

In addition, the magnetic induction components 630_1-630_9 include the first magnetic induction components 630_1, 630_7 and 630_9 respectively disposed in the first chutes C_11, C_12 and C_13, the second magnetic induction components 630_2 and 630_4 respectively disposed in the second chutes C_21 and C_22, the third magnetic induction components 630_6 and 630_8 respectively disposed in the third chutes C_31 and C_32, and the fourth magnetic induction components 630_3 and 630_5 respectively disposed in the fourth chutes C_42 and C_43.

Figure 7:
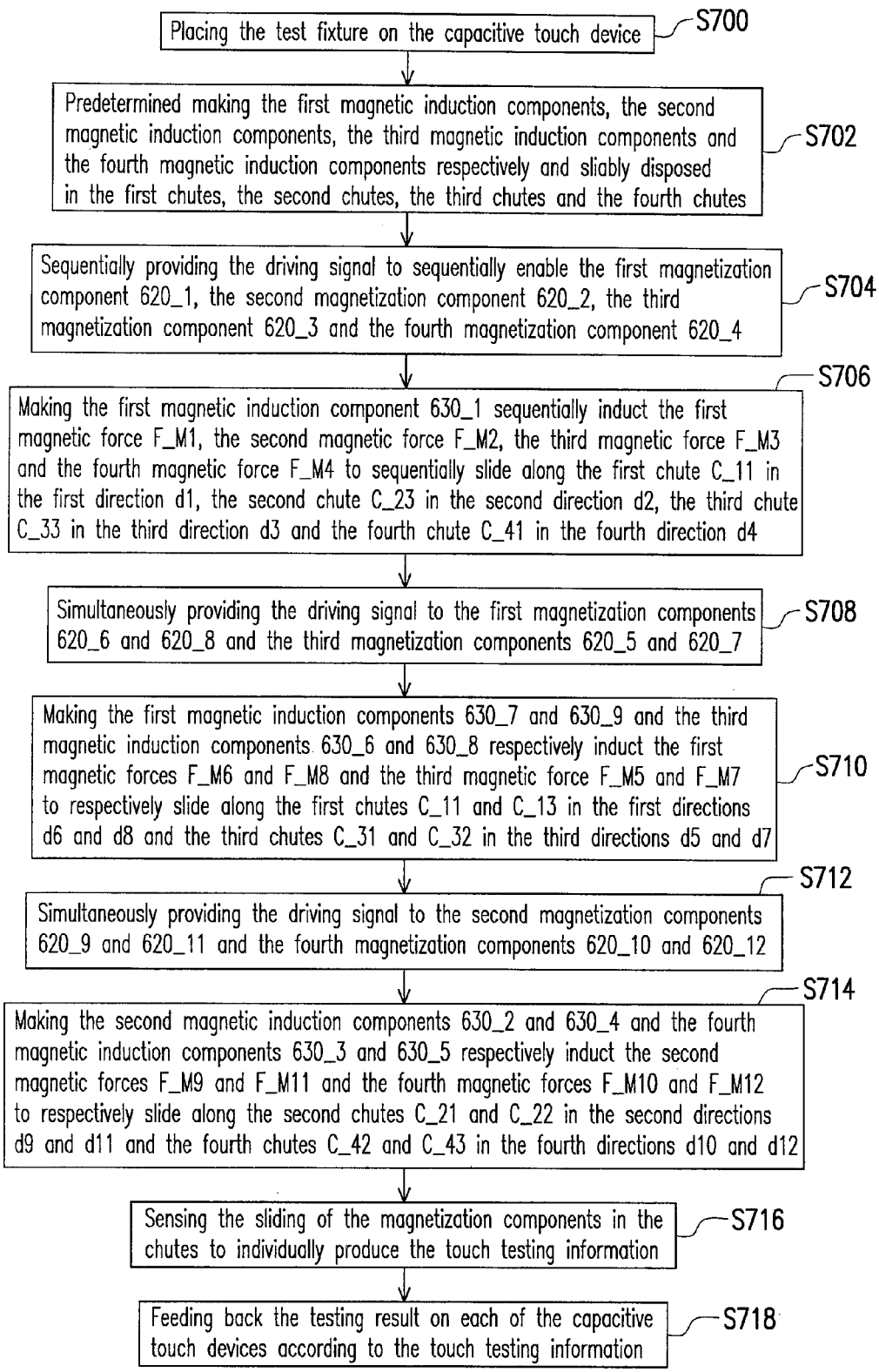
FIG. 7 is a flowchart of a touch testing method according to the embodiment of FIG. 6.

FIG. 7 is a flowchart of a touch testing method according to the embodiment of FIG. 6. Referring to FIGS. 6 and 7, after the operator places the test fixture 610 on capacitive touch devices 10_1-10_9 (step S700), the first magnetic induction components 630_1, 630_7 and 630_9, the second magnetic induction components 630_2 and 630_4, the third magnetic induction components 630_6 and 630_8 and the fourth magnetic induction components 630_3 and 630_5 are predetermined to be respectively and sliably disposed in the first chutes C_11, C_12 and C_13, the second chutes C_21 and C_22, the third chutes C_31 and C_32 and the fourth chutes C_42 and C_43 (step S702).

When the touch testing system 600 starts testing on the capacitive touch devices 10_1-10_9, the driving unit 640 sequentially provides the driving signal s_d to the first magnetization component 620_1, the second magnetization component 620_2, the third magnetization component 620_3 and the fourth magnetization component 620 4 for enabling (step S704), so that the first magnetic induction component 630_1 sequentially inducts the first magnetic force F_M1, the second magnetic force F_M2, the third magnetic force F_M3 and the fourth magnetic force F_M4 to sequentially slide along the first chute C_11 in the first direction d1, the second chute C_23 in the second direction d2, the third chute C_33 in the third direction d3 and the fourth chute C_41 in the fourth direction d4 (step S706). Herein, the first direction d1 and the third direction d3 are substantially corresponding to a horizontal direction but towards opposite direction to each other, and the second direction d2 and the fourth direction d4 are substantially corresponding to a vertical direction but towards opposite direction to each other.

Then, the driving unit 640 simultaneously provides the driving signal s_d to the first magnetization components 620_6 and 620_8 and the third magnetization components 620_5 and 620_7 (step S708), so that the first magnetic induction components 630_7 and 630_9 and the third magnetic induction components 630_6 and 630_8 respectively induct the first magnetic forces F_M6 and F_M8 and the third magnetic force F_M5 and F_M7 to respectively slide along the first chutes C_11 and C_13 in the first directions d6 and d8 and the third chutes C_31 and C_32 in the third directions d5 and d7 (step S710). The first directions d1, d6 and d8 and the third directions d5 and d7 are substantially corresponding to a horizontal direction and towards the same direction.

After the testing on the first edge and the third edge of each of the touching areas 12_1-12_9 is finished, the driving unit 640 switches to simultaneously provide the driving signal s_d to the second magnetization components 620_9 and 620_11 and the fourth magnetization components 620_10 and 620_12 (step S712), so that the second magnetic induction components 630_2 and 630 4 and the fourth magnetic induction components 630_3 and 630_5 respectively induct the second magnetic forces F_M9 and F_M11 and the fourth magnetic forces F_M10 and F_M12 to respectively slide along the second chutes C_21 and C_22 in the second directions d9 and d11 and the fourth chutes C_42 and C_43 in the fourth directions d10 and d12 (step S714). The second directions d9 and d11 and the fourth directions d10 and d12 are substantially corresponding to a vertical direction and towards the same direction.

Finally, the sensing units SU1-SU9 of all the capacitive touch devices 10_1-10_9 respectively sense the sliding of each the magnetization component in the chute to individually produce one of the touch testing information D_t1-D_t9 (step S716), and after the driving unit 640 receives the individually produced touch testing information D_U-D_t9, the testing result TR on each of the capacitive touch devices 10_1-10_9 is fed back according to the touch testing information D_t1-D_t9 (step S718).

At the time, the touch testing system 600 has made the magnetic induction components 630_1-630_9 respectively slide through the edges of each of the touching areas 12_1-12_3 and delivered the touch testing information D_t1-D_t9 produced by the sensing units SU1-SU9 corresponding to the capacitive touch devices 10_1-10_9 to the driving unit 640. Then, the driving unit 640 would integrate the received touch testing information D_t1 -D_t9 and output the testing results TR to the external host, so that the operator is aware of whether or not the capacitive touch panels TP1-TP9 of the capacitive touch devices 10_1-10_9 are normal.

In more details, a first set of magnetic induction components in the embodiment (the first magnetic induction component 630_1) inducts a first set of magnetic forces (the first magnetic force F_M1, the second magnetic force F_M2, the third magnetic force F_M3 and the fourth magnetic force F_M4) to sequentially slide along a first set of chutes (the first chute C_11, the second chute C_23, the third chute C_33 and the fourth chute C_41). A second set of magnetic induction components (the first magnetic induction components 630_7 and 630_9 and the third magnetic induction components 630_6 and 630_8) inducts a second set of magnetic forces (the first magnetic forces F_M6 and F_M8 and the third magnetic forces F_M5 and F_M7) to simultaneously slide along a second set of chutes (the first chutes C_12 and C_13 and the third chute C_31 and C_32. A third set of magnetic induction components (the second magnetic induction components 630_2 and 630_4 and the fourth magnetic induction components 630_6 and 630_5) inducts a third set of magnetic forces (the second magnetic forces F_M9 and F_M11 and the fourth magnetic forces F_M10 and F_M12) to simultaneously slide along a third set of chutes (the second chutes C_21 and C_22 and the fourth chute C_42 and C_43. The first set of chutes herein partially surrounds the second and third set of chutes, and the second and third set of chutes are orthogonal to each other.

In other words, in the embodiment, first, the touch testing system 600 sequentially enables the magnetization components 620_1-620_4 corresponding to the outmost chutes to make the first magnetic induction component 630_1 slide along the outmost chutes. Next, the driving unit 640 simultaneously enables the magnetization components 620_5-620_8 to make the corresponding magnetic induction components 630_6-630_9 slide along the corresponding chutes in the horizontal direction. Finally, the driving unit 640 simultaneously enables the magnetization components 620_9-620_12 to make the corresponding magnetic induction components 630_2-630_5 slide along the corresponding chutes in the vertical direction. However, the invention does not limit the above-mentioned procedure.

It should be noted that, in the embodiment, the intervals between the capacitive touch devices 10_1-10_9 are determined by the design of the carrying platform. The designer can make the intervals between the capacitive touch devices 10_1-10_9 quite small so that the magnetic induction components in adjacent chutes simultaneously induct the magnetic force produced by a same magnetization components to slide. For example, when the intervals between the first line of capacitive touch devices 10_1-10_3 and the second line of capacitive touch devices 10_4-10_6 are quite small, i.e., the third chute C_31 and the first chute C_12 are quite close, it is allowed to dispose one first magnetization component 620_5 or one third magnetization component 620_6 between the third chute C_31 and the first chute C_12 in the touch testing system 600, while both the third magnetic induction component 6306 and the first magnetic induction component 630_7 simultaneously induct the magnetic force of the first magnetization component 620_5 or the third magnetization component 620_6 to slide along the chutes, which can further reduce the quantity of the magnetization components and the cost.

Figure 8:
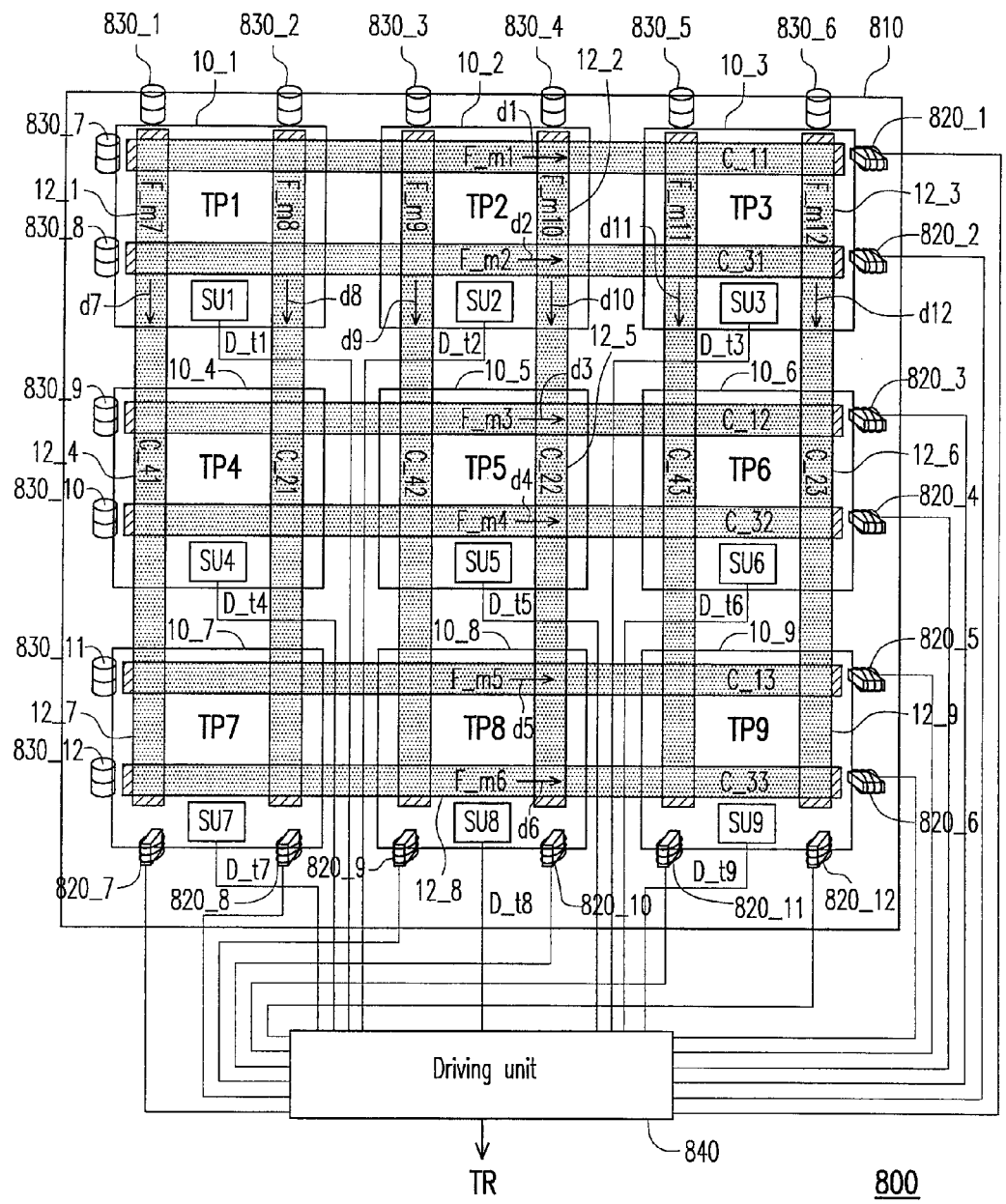
FIG. 8 is a schematic diagram of a touch testing system 800 according to an embodiment of the present invention.

FIG. 8 is a schematic diagram of a touch testing system 800 according to an embodiment of the present invention. In the embodiment, the configuration of the capacitive touch devices 10_1-10_9, the test fixture 810 and the chutes C_11-C_33 are the same as the embodiment of FIG. 3, which is omitted to describe.

Referring to FIG. 8, the difference of the embodiment from the one of FIG. 6 rests in the configuration of the magnetization components 820_1-820_12 and the magnetic induction components 830_1-830_12. In more details, the magnetization components 820_1-820_12 include first magnetization components 820_1, 820_3 and 820_5, second first magnetization components 820_8, 820_10 and 820_12, third first magnetization components 820_2, 820_4 and 820_6 and fourth first magnetization components 820_7, 820_9 and 820_11. Herein, the first magnetization components 820_1, 820_3 and 820_5 respectively provide first magnetic forces F_m1, F_m3 and F_m5 respectively with first directions d1, d3 and d5 according to the driving signal s_d. The second magnetization components 820_8, 820_10 and 820_12 respectively provide second magnetic forces F_m8, F_m10 and F_m12 respectively with second directions d8, d10 and d12 according to the driving signal s_d. The third magnetization components 820_2, 820_4 and 820_6 respectively provide third magnetic forces F_m2, F_m4 and F_m6 respectively with third directions d2, d4 and d6 according to the driving signal s_d. The fourth magnetization components 820_7, 820_9 and 820_11 respectively provide fourth magnetic forces F_m7, F_m9 and F_m11 respectively with fourth directions d7, d9 and d11 according to the driving signal s_d.

In addition, the magnetic induction components 830_1-830_12 include first magnetic induction components 830_7, 830_9 and 830_11 respectively disposed in the first chute C_11, C_12 and C_13, second magnetic induction components 830_2, 830_4 and 830_6 respectively disposed in the second chute C_21, C_22 and C_23, third magnetic induction components 830_8, 830_10 and 830_12 respectively disposed in the third chute C_31, C_32 and C_33 and fourth magnetic induction components 830_1, 830_3 and 830_5 respectively disposed in the fourth chute C_41, C_42 and C_43.

Figure 9:
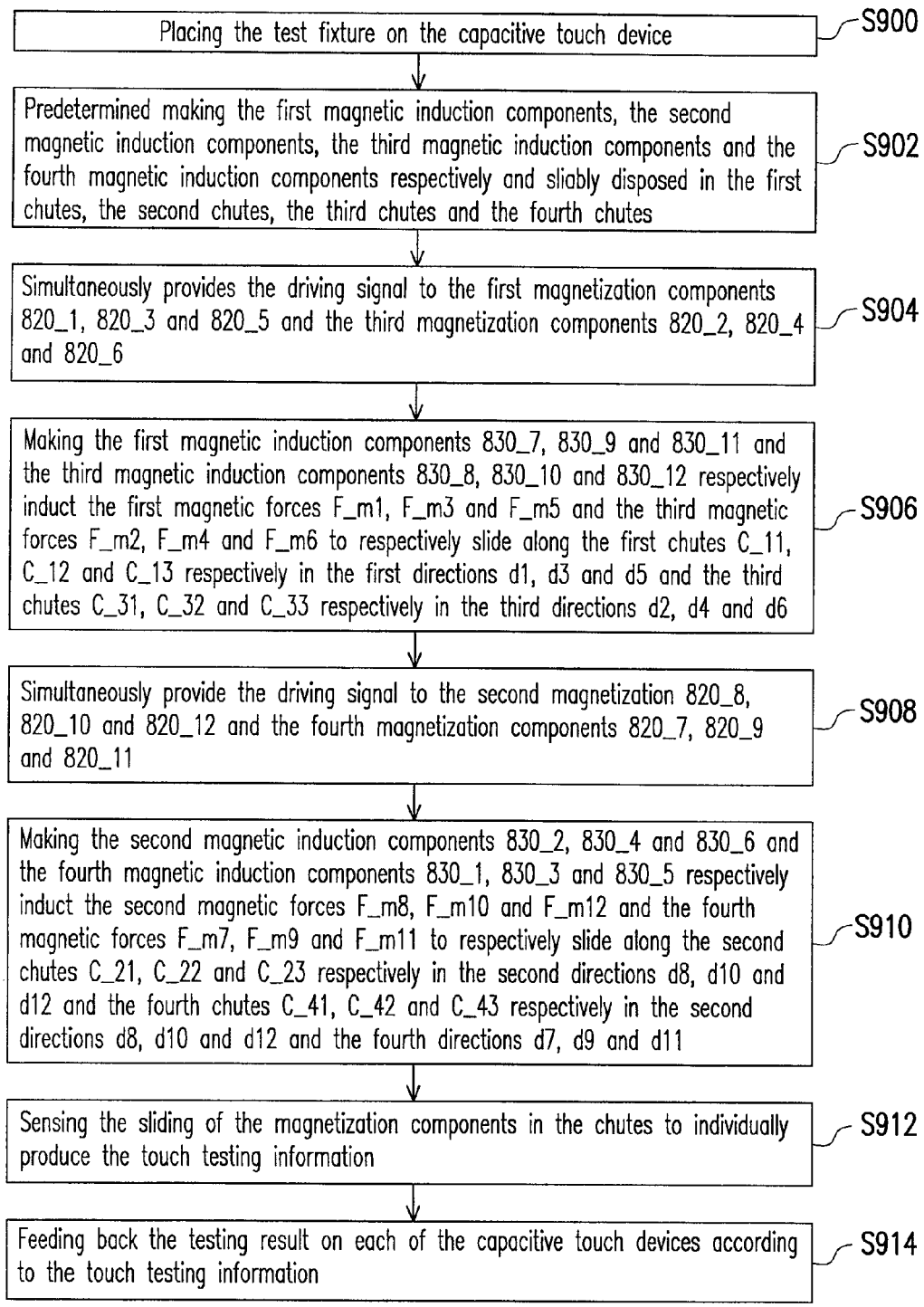
FIG. 9 is a flowchart of a touch testing method according to the embodiment of FIG. 8.

FIG. 9 is a flowchart of a touch testing method according to the embodiment of FIG. 8. Referring to FIGS. 8 and 9, after the operator places the test fixture 810 on the capacitive touch devices 10_1-10_9 (step S900), the first magnetic induction components 830_7, 830_9 and 830_11, the second magnetic induction components 830_2, 830_4 and 830_6, the third magnetic induction components 830_8, 830_10 and 830_12 and the fourth magnetic induction components 830_1, 830_3 and 830_5 are predetermined to be respectively and sliably disposed in the first chutes C_11, C_12 and C_13, the second chutes C_21, C_22 and C_23, the third chutes C_31, C_32 and C_33 and the fourth chutes C_41, C_42 and C_43 (step S902).

When the touch testing system 800 starts testing on the capacitive touch devices 10_1-10_9, first, the driving unit 840 simultaneously provides the driving signal s_d to the first magnetization components 820_1, 820_3 and 820_5 and the third magnetization components 820_2, 820_4 and 820_6 (step S904), and the first magnetic induction components 830_7, 830_9 and 830_11 and the third magnetic induction components 830_8, 830_10 and 830_12 respectively induct the first magnetic forces F_m1, F_m3 and F_m5 and the third magnetic forces F_m2, F_m4 and F_m6 to respectively slide along the first chutes C_11, C_12 and C_13 respectively in the first directions d1, d3 and d5 and the third chutes C_31, C_32 and C_33 respectively in the third directions d2, d4 and d6 (step S906). Herein, the first directions d1, d3 and d5 and the third directions d2, d4 and d6 are substantially corresponding to a horizontal direction and towards the same direction (towards right herein).

Similarly, after the testing on the first edge and the third edge of each of the touching areas 12_1-12_9 is finished, the driving unit 840 switches to simultaneously provide the driving signal s_d to the second magnetization components 820_8, 820_10 and 820_12 and the fourth magnetization components 820_7, 820_9 and 820_11 (step S908). The second magnetic induction components 830_2, 830_4 and 830_6 and the fourth magnetic induction components 830_1, 830_3 and 830_5 respectively induct the second magnetic forces F_m8, F_m10 and F_m12 and the fourth magnetic forces F_m7, F_m9 and F_m11 to respectively slide along the second chutes C_21, C_22 and C_23 respectively in the second directions d8, d10 and d12 and the fourth chutes C_41, C_42 and C_43 respectively in the second directions d8, d10 and d12 and the fourth directions d7, d9 and d11 (step S910). Herein, the second directions d8, d10 and d12 and the fourth directions d7, d9 and d11 are corresponding to a vertical direction and towards the same direction (towards up herein).

Steps S912 and S914 are the same as the previous steps S716 and S718, which is omitted to describe.

At the time, the touch testing system 800 has made the magnetic induction components 830_1-830_12 respectively slide through the edges of each of the touching areas 12_1-12_3 and delivered the touch testing information D_t1-D_t9 produced by the sensing units SU1-SU9 corresponding to the capacitive touch devices 10_1-10_9 to the driving unit 840. Then, the driving unit 840 would integrate the received touch testing information D_t1-D_t9 and output the testing results TR to the external host, so that the operator is aware of whether or not the capacitive touch panels TP1-TP9 of the capacitive touch devices 10_1-10_9 are normal.

In other words, in the embodiment, first, the touch testing system 800 simultaneously enables the first magnetization components 820_1, 820_3 and 820_5 and the third magnetization components 820_2, 820_4 and 820_6 to make the first magnetic induction components 830_7, 830_9 and 830_11 and the third magnetic induction components 830_8, 830_10 and 830_12 slide along the corresponding chutes in the horizontal direction. Next, the driving unit 840 simultaneously enables the second magnetization components 820_8, 820_10 and 820_12 and the fourth magnetization components 820_7, 820_9 and 820_11 to make the corresponding second magnetic induction components 830_2, 830_4 and 830_6 and fourth magnetic induction components 830_1, 830_3 and 830_5 slide along the corresponding chutes in the vertical direction. In short, the touch testing system 800 of the embodiment only asks the driving unit 840 to switch the driving signal one time to complete the testing on all the capacitive touch devices 10_1-10_9.

Figure 10:
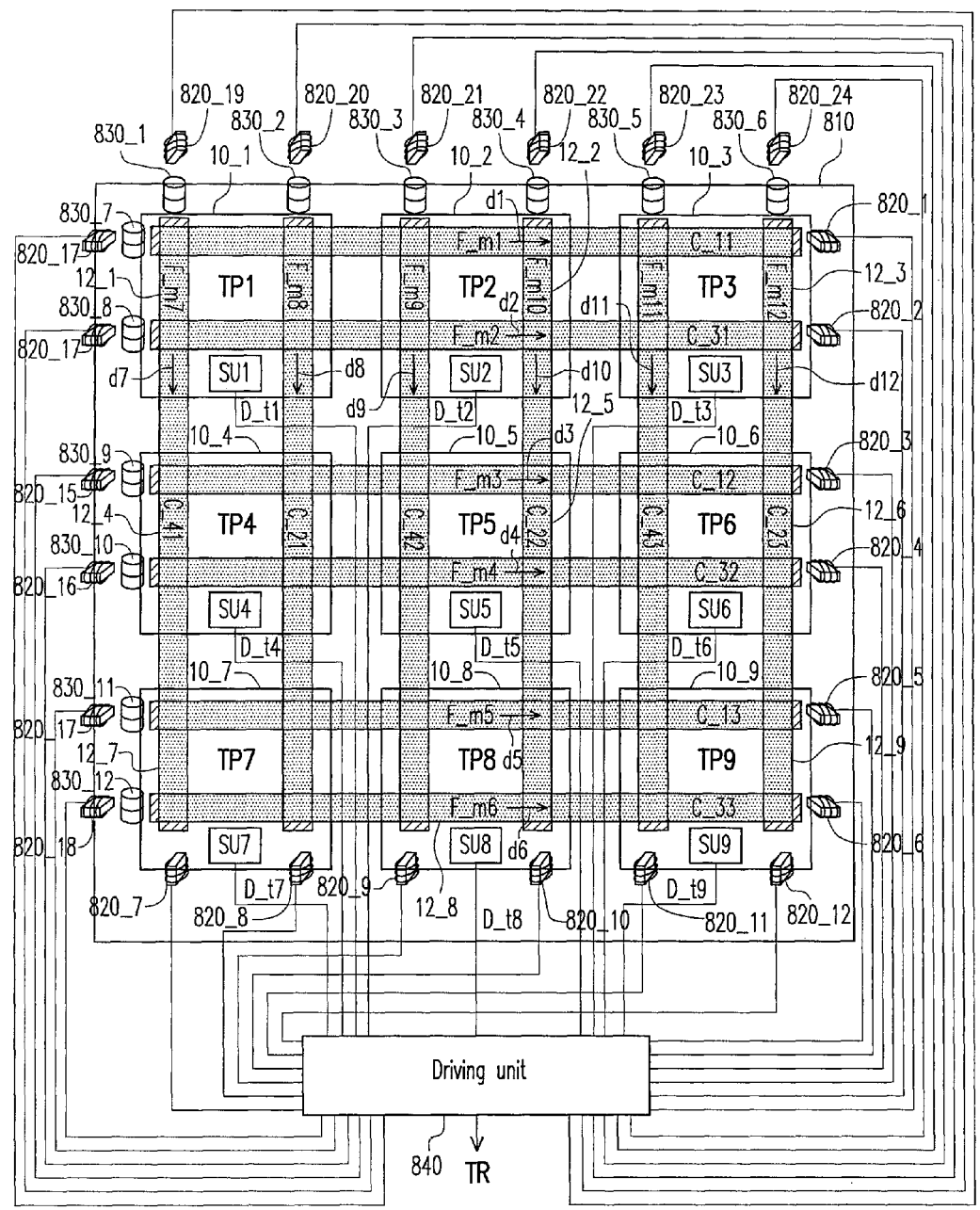
FIG. 10 is a schematic diagram of a touch testing system 1000 according to an embodiment of the present invention.

FIG. 10 is a schematic diagram of a touch testing system 1000 according to an embodiment of the present invention. In the embodiment, the architecture and the driving method of the touch testing system 1000 are roughly same as the touch testing system 800 of the embodiment in FIG. 8, so that the same content can refer to the description above, which is omitted to describe.

In the embodiment, differently from the above-mentioned embodiment, the touch testing system 1000 further employs a plurality of magnetization components 820_13-820_24 with opposite magnetic force directions at another side of the original magnetization components 820_1-820_12. Among them, the first magnetization components 820_13, 820_15 and 820_17 respectively provide magnetic forces opposite to the ones of the first magnetization components 820_1, 820_3 and 820 5. The second magnetization components 820_20, 820_22 and 820_24 respectively provide magnetic forces opposite to the ones of the second magnetization components 820_8, 820_10 and 820_12. The third magnetization components 820_14, 820_16 and 820_18 respectively provide magnetic forces opposite to the ones of the third magnetization components 820_2, 820_4 and 820_6. The fourth magnetization components 820_19, 820_21 and 820_23 respectively provide magnetic forces opposite to the ones of the fourth magnetization components 820_7, 820_9 and 820_11.

In the previous embodiment, during the touch testing, after finishing testing on a batch of capacitive touch devices (in the above-mentioned embodiment, nine capacitive touch devices are counted as one batch), in order to conduct testing on the next batch of capacitive touch devices, it is needed to respectively resume the magnetic induction components 830_1-830_12 to the original positions where the testing starts so as to continue the subsequent touch testing. To be more efficient, in the embodiment, the touch testing system 1000 further employs a plurality of magnetization components 820_13-820_24 with opposite magnetic force directions at another side of each of the magnetization components 820_1-820_12 corresponding to the chutes, so that during the touch testing for the next batch of capacitive touch devices, the touch testing system 1000 can use opposite sliding directions to make the magnetic induction components directly test the capacitive touch devices without resuming the magnetic induction components to their start positions.

Specifically, after finishing the first touch testing on the first batch of capacitive touch devices, the first magnetic induction components 830_7, 830_9 and 830_11 and the third magnetic induction components 830_8, 830_10 and 830_12 respectively induct the magnetic forces of the first magnetization components 820_1, 820_3 and 820_5 and the third magnetization components 820_2, 820_4 and 820_6 to respectively slide to the down-side position in the corresponding chute.

Then, the operator places the next batch of capacitive touch devices and starts the second touch testing. At the time, the driving unit 840 switches to enable the first magnetization components 820_13, 820_15 and 820_17 and the third magnetization components 820_14, 820_16 and 820_18, so that the first magnetic induction components 830_7, 830_9 and 830_11 and third magnetic induction components 830_8, 830_10 and 830_12 at the right side respectively induct the corresponding magnetic forces to slide back to the left side along the chutes. After finishing the testing in the horizontal direction. The driving unit 840 switches to enable the second magnetization components 820_20, 820_22 and 820_24 and the fourth magnetization components 820_19, 820_21 and 82023, so that the second magnetic induction components 830_2, 830_4 and 830_6 and fourth magnetic induction components 830_1, 830_3 and 830_5 at the down side respectively induct the corresponding magnetic forces to slide back to the upper side along the chutes.

At the time, the touch testing system 1000 finishes the second touch testing while the magnetic induction components 830_1-830_12 return back the positions prior to conducting the first touch testing. When the touch testing system 1000 wants to conduct the testing on the next batch of capacitive touch devices, it follows the touch testing method of FIG. 9, and analogically for the rest.

In summary, the touch testing system in the embodiments of the invention not only uses the mechanism action of the chute to make the magnetic induction component used for testing slide on the fixed direction, but also, through controlling the corresponding magnetic force provided by the magnetization component, makes the magnetic induction component stably slide in the chute, which can largely advance the stability during the testing and the testing accuracy without increasing additional cost. In addition, the touch testing system and the touch testing method also provide an architecture for simultaneously testing a plurality of capacitive touch devices to further reduce the testing time and advance the testing efficiency.

It will be apparent to those skilled in the art that the descriptions above are several preferred embodiments of the present invention only, which does not limit the implementing range of the present invention. Various modifications and variations can be made to the structure of the present invention without departing from the scope or spirit of the invention.

What is claimed is:

1. A touch testing system, configured to conduct test on at least one capacitive touch device, wherein the capacitive touch device comprises a capacitive touch panel and a sensing unit and the capacitive touch panel has a touching area; the touch testing system comprising:
   a test fixture, disposed on the at least one capacitive touch device, wherein the test fixture has at least one chute on a position corresponding to the touching area;
   at least one magnetization component, disposed on the test fixture, wherein the at least one magnetization component is enabled according to a driving signal and thereby produces a magnetic force;
   at least one magnetic induction component, slidably disposed in the at least one chute and inducting the magnetic force to slide along the at least one chute so that the sensing unit thereby produces a touch testing information; and
   a driving unit, coupled to at least one magnetization component and the sensing unit, providing the driving signal to enable the at least one magnetization component and receiving the touch testing information so as to feed back a testing result on the at least one capacitive touch device according to the touch testing information.

2. The touch testing system as claimed in claim 1, wherein the touching area comprises a first edge, a second edge, a third edge and a fourth edge, and the at least one chute comprises:
   a first chute, corresponding to the first edge;
   a second chute, corresponding to the second edge;
   a third chute, corresponding to the third edge; and
   a fourth chute, corresponding to the fourth edge.

3. The touch testing system as claimed in claim 2, wherein the at least one magnetization component comprises:
   a first magnetization component, corresponding to the first chute and enabled according to the driving signal so as to provide a first magnetic force with a first direction;
   a second magnetization component, corresponding to the second chute and enabled according to the driving signal so as to provide a second magnetic force with a second direction;
   a third magnetization component, corresponding to the third chute and enabled according to the driving signal so as to provide a third magnetic force with a third direction; and
   a fourth magnetization component, corresponding to the fourth chute and enabled according to the driving signal so as to provide a fourth magnetic force with a fourth direction.

4. The touch testing system as claimed in claim 3, wherein the at least one magnetic induction component is predetermined slidably disposed in the first chute, wherein the driving unit sequentially provides the driving signal to the first magnetization component, the second magnetization component, the third magnetization component and the fourth magnetization component, so that the magnetic induction component sequentially inducts the first magnetic force, the second magnetic force, the third magnetic force and the fourth magnetic force and thereby sequentially slides along the first chute in the first direction, slides along the second chute in the second direction, slides along the third chute in the third direction and slides along the fourth chute in the fourth direction, wherein the first direction and the third direction are substantially corresponding to a horizontal direction but towards opposite direction to each other, and the second direction and the fourth direction are substantially corresponding to a vertical direction but towards opposite direction to each other.

5. The touch testing system as claimed in claim 3, wherein the at least one magnetic induction component comprises a first magnetic induction component, a second magnetic induction component, a third magnetic induction component and a fourth magnetic induction component, wherein the first magnetic induction component, the second magnetic induction component, the third magnetic induction component and the fourth magnetic induction component are predetermined respectively and slidably disposed in the first chute, the second chute, the third chute and the fourth chute.

6. The touch testing system as claimed in claim 5, wherein the driving unit simultaneously provides the driving signal to the first magnetization component and the third magnetization component so that the first magnetic induction component and the third magnetic induction component respectively induct the first magnetic force and the third magnetic force to respectively slide along the first chute in the first direction and along the third chute in the third direction, wherein the first direction and the third direction are substantially corresponding to a horizontal direction and towards the same direction.

7. The touch testing system as claimed in claim 5, wherein the driving unit simultaneously provides the driving signal to the second magnetization component and the fourth magnetization component so that the second magnetic induction component and the fourth magnetic induction component respectively induct the second magnetic force and the fourth magnetic force to respectively slide along the second chute in the second direction and along the fourth chute in the fourth direction, wherein the second direction and the fourth direction are substantially corresponding to a vertical direction and towards the same direction.

8. The touch testing system as claimed in claim 1, wherein the at least one capacitive touch device comprises a plurality of capacitive touch devices with the same structure, and the touch testing system further comprises:

a carrying platform, for fixing the capacitive touch devices in array way, wherein the at least one chute is further corresponding to the position of each of the touching areas, wherein each of the sensing units senses sliding of the at least one magnetic induction component in the at least one chute to individually produce the touch testing information, wherein the driving unit further receives each of the touch testing information to thereby feed back the testing result on each of the capacitive touch devices.

9. The touch testing system as claimed in claim 1, wherein the at least one capacitive touch device comprises a plurality of capacitive touch devices with the same structure, the at least one chute comprises a plurality of chutes respectively corresponding to the edge of each of the touching areas, the at least one magnetization component comprises a plurality of magnetization components respectively corresponding to each of the chutes, and the at least one magnetic induction component comprises a plurality of magnetic induction components partially corresponding to a plurality of magnetic induction components of the chutes, wherein the driving unit provides the driving signal to enable each of the magnetization components so that each of the magnetization components thereby produces the directional magnetic force, wherein a first set of magnetic induction components inducts a first set of magnetic forces and sequentially slides along a first set of chutes, a second set of magnetic induction components inducts a second set of magnetic forces and simultaneously slides along a second set of chutes, and a third set of magnetic induction components inducts a third set of magnetic forces and simultaneously slides along a third set of chutes, wherein the first set of chutes partially surrounds the second set of chutes and the third set of chutes, and the second set of chutes and the third set of chutes are orthogonal to each other.

10. A touch testing method, configured to conduct test on at least one capacitive touch device, wherein the capacitive touch device comprises a capacitive touch panel and a sensing unit and the capacitive touch panel has a touching area; the touch testing method comprising:

disposing a test fixture on the at least one capacitive touch device, wherein the test fixture has at least one chute on a position corresponding to the touching area;

slidably disposing at least one magnetic induction component in the at least one chute;

providing a driving signal to enable at least one magnetization component so that the at least one magnetization component thereby produces a magnetic force;

making the at least one magnetic induction component induct the magnetic force to slide along the at least one chute so that the sensing unit thereby produces a touch testing information; and feeding back a testing result on the at least one capacitive touch device according to the touch testing information.

11. The touch testing method as claimed in claim 10, wherein the touching area comprises a first edge, a second edge, a third edge and a fourth edge, the at least one chute comprises a first chute corresponding to the first edge, a second chute corresponding to the second edge a third chute corresponding to the third edge and a fourth chute corresponding to the fourth edge, and the at least one magnetization component comprises a first magnetization component, a second magnetization component, a third magnetization component and a fourth magnetization component, and the touch testing method further comprises:

predetermined specifying the at least one magnetic induction component to slidably be disposed in the first chute;

sequentially providing the driving signal to enable the first magnetization component, the second magnetization component, the third magnetization component and the fourth magnetization component, so that the first magnetization component thereby produces a first magnetic force with a first direction, the second magnetization component thereby produces a second magnetic force with a second direction, the third magnetization component thereby produces a third magnetic force with a third direction and the fourth magnetization component thereby produces a fourth magnetic force with a fourth direction, wherein the first magnetization component is corresponding to the first chute, the second magnetization component is corresponding to the second chute, the third magnetization component is corresponding to the third chute and the fourth magnetization component is corresponding to the fourth chute; and making the at least one magnetic induction component sequentially induct the first magnetic force, the second magnetic force, the third magnetic force and the fourth magnetic force and thereby sequentially slide along the first chute in the first direction, slides along the second chute in the second direction, slides along the third chute in the third direction and slides along the fourth chute in the fourth direction, wherein the first direction and the third direction are substantially corresponding to a horizontal direction but towards opposite direction to each other, and the second direction and the fourth direction are substantially corresponding to a vertical direction but towards opposite direction to each other.

12. The touch testing method as claimed in claim 10, wherein the touching area comprises a first edge, a second edge, a third edge and a fourth edge, and the at least one chute comprises a first chute corresponding to the first edge, a second chute corresponding to the second edge, a third chute corresponding to the third edge and a fourth chute corresponding to the fourth edge, and the at least one magnetic induction component comprises a first magnetic induction component, a second magnetic induction component, a third magnetic induction component and a fourth magnetic induction component, wherein the step of slidably disposing the at least one magnetic induction component in the at least one chute comprises:

predetermined specifying the first magnetic induction component, the second magnetic induction component, the third magnetic induction component and the fourth magnetic induction component respectively and slidably to be disposed in the first chute, the second chute, the third chute and the fourth chute.

13. The touch testing method as claimed in claim 12, wherein the at least one magnetization component comprises a first magnetization component corresponding to the first chute, a second magnetization component corresponding to the second chute, a third magnetization component corresponding to the third chute and a fourth magnetization component corresponding to the fourth chute and the step of providing the driving signal to enable at least one magnetization component comprises:

simultaneously providing the driving signal to the first magnetization component and the third magnetization component so that the first magnetization component thereby produces a first magnetic force with a first direction and the third magnetization component produces a third magnetic force with a third direction.

14. The touch testing method as claimed in claim 13, wherein the step of making the at least one magnetic induction component induct the magnetic force to slide along the at least one chute comprises:

making the first magnetic induction component and the third magnetic induction component respectively induct the first magnetic force and the third magnetic force to respectively slide along the first chute in the first direction and along the third chute in the third direction, wherein the first direction and the third direction are substantially corresponding to a horizontal direction and towards the same direction.

15. The touch testing method as claimed in claim 14, wherein after the first magnetic induction component and the third magnetic induction component slide respectively along the first chute and along the third chute, the step of providing the driving signal to enable at least one magnetization component further comprises:

simultaneously providing the driving signal to the second magnetization component and the fourth magnetization component so that the second magnetization component thereby produces a second magnetic force with a second direction and the fourth magnetization component produces a fourth magnetic force with a fourth direction.

16. The touch testing method as claimed in claim 15, wherein the step of making the at least one magnetic induction component induct the magnetic force to slide along the at least one chute further comprises:

making the second magnetic induction component and the fourth magnetic induction component respectively induct the second magnetic force and the fourth magnetic force to respectively slide along the second chute in the second direction and along the fourth chute in the fourth direction, wherein the second direction and the fourth direction are substantially corresponding to a vertical direction and towards the same direction.

17. The touch testing method as claimed in claim 10, wherein the at least one capacitive touch device comprises a plurality of capacitive touch devices with the same structure, and the at least one chute is further corresponding to the position of each of the touching areas, and the touch testing method further comprises:

making each of the sensing sense the sliding of the at least one magnetic induction component in the at least one chute so as to individually produce the touch testing information; and feeding back the testing result on each of the capacitive touch devices according to the touch testing information.

18. The touch testing method as claimed in claim 10, wherein the at least one capacitive touch device comprises a plurality of capacitive touch devices with the same structure, the at least one chute comprises a plurality of chutes respectively corresponding to the edge of each of the touching areas, the at least one magnetization component comprises a plurality of magnetization components respectively corresponding to each of the chutes, and the at least one magnetic induction component comprises a plurality of magnetic induction components partially corresponding to the chutes, wherein the step of providing the driving signal to enable at least one magnetization component so that the at least one magnetization component thereby produces the magnetic force comprises:

providing the driving signal to enable each of the magnetization components so that each of the magnetization components thereby produces the directional magnetic force.

19. The touch testing method as claimed in claim 18, wherein the step of making the at least one magnetic induction component induct the magnetic force to slide along the at least one chute so that the sensing unit thereby produces the touch testing information comprises:

making a first set of magnetic induction components induct a first set of magnetic forces and sequentially slide along a first set of chutes;

making a second set of magnetic induction components induct a second set of magnetic forces and simultaneously slide along a second set of chutes; and making a third set of magnetic induction components induct a third set of magnetic forces and simultaneously slide along a third set of chutes, wherein the first set of chutes partially surrounds the second set of chutes and the third set of chutes, and the second set of chutes and the third set of chutes are orthogonal to each other.

* * * * *